United States Patent [19]
Burns et al.

[11] Patent Number: 5,997,947
[45] Date of Patent: Dec. 7, 1999

[54] ROTISSERIE FIXTURE FOR COATING AIRFOILS

[75] Inventors: Steven M. Burns, Waterbury; Richard W. Varsell, Bristol, both of Conn.

[73] Assignee: United Technologies Corporation, Hartford, Conn.

[21] Appl. No.: 09/067,767

[22] Filed: Apr. 29, 1998

[51] Int. Cl.[6] ...................................................... B05D 3/12
[52] U.S. Cl. .................................. 427/240; 118/723 EB; 118/53; 118/500; 427/255.5; 427/585
[58] Field of Search ................................... 427/240, 585, 427/255.5; 118/723 EB, 53, 500

[56] References Cited

U.S. PATENT DOCUMENTS

4,108,107  8/1978  Scheuermann .
4,192,253  3/1980  Aichert et al. ........................... 118/712
4,485,759  12/1984  Brandoff ................................. 118/503
4,969,790  11/1990  Petz et al. ............................... 414/217

*Primary Examiner*—Janyce Bell
*Attorney, Agent, or Firm*—Bachman & LaPointe, P.C.

[57] ABSTRACT

The present invention relates to a modular, rotisserie type coating fixture for use in electronic beam physical vapor deposition (EB-PVD) coating processes. The fixture includes a support structure which rotates about a first axis during coating and a plurality of cassettes mounted within the support structure. The cassettes each hold a plurality of workpieces to be coated and are mounted in the support structure so that they rotate about axes parallel to the first axis. This allows each workpiece being coated to rotate about its longitudinal axis and to achieve an evenly distributed, substantially uniform coating on surfaces of the workpiece to be coated.

20 Claims, 6 Drawing Sheets

ROTISSERIE FIXTURE FOR COATING AIRFOILS

BACKGROUND OF THE INVENTION

The present invention relates to a rotisserie type fixture to be used for coating workpieces, such as airfoils and vanes for industrial turbines and jet engines.

Airfoils, such as vanes, used in industrial turbines and jet engines are typically subjected to a coating operation to improve their resistance to corrosion and thermal fatigue, and to otherwise enhance their performance. Economic concerns dictate that one must be able to simultaneously coat multiple airfoils in order to have a viable commercial process.

Fixtures for use in PVD coating processes for airfoils and vanes are known. Typically, such fixtures provide only rotation of the airfoils, which are immovable and horizontally placed in the fixture around the axis of a horizontal shaft. The disadvantages of such fixtures are poor adhesion of coatings on surfaces and unequal thickness of coatings on such surfaces.

There are also well known fixtures which provide simultaneous rotation of workpieces being coated around their own axis and around the axis of the shaft. U.S. Pat. No. 4,108,107 to Scheuerman illustrates one such fixture. Unfortunately, such fixtures can not provide airfoils having platform and shroud surfaces with coatings having good adhesion properties. Additionally, the fixtures have a very complicated construction with a planetary mechanism and twin shaft constructions.

One commercial system for simultaneously coating a plurality of workpieces is shown in U.S. Pat. No. 4,192,253. In this system, a plurality of workpieces to be coated are inserted into a coating chamber and simultaneously rotated about their longitudinal axes during the coating operation. The simultaneous rotation of the workpieces around their longitudinal axes is accomplished by mounting each workpiece to the tip of a fixture whose other end is connected to a complex gear operated drive system for rotating the fixture and the individual workpieces mounted thereto. This type of system suffers from the problems previously discussed. For example, the system is complex and potentially troublesome from a maintenance standpoint. Still further, the costs associated with such a system are quite high. Yet another disadvantage is the inability of the system to provide good quality coatings on surfaces of an airfoil.

More recently, it has been proposed to coat multiple workpieces at a single time using a single modular fixture arrangement. Such a coating system is illustrated in copending, allowed U.S. patent application Ser. No. 08/782, 398, filed on Jan. 13, 1997, to John W. Menchetti et al., entitled MODULAR COATING FIXTURE, assigned to the assignee of the instant application.

Certain coating techniques, such as electron beam physical vapor deposition (EB-PVD), are line of sight techniques wherein surfaces of a workpiece which are not in a line of sight with the source of the coating material will not be coated. Efforts have been made to create coating fixtures which place all surfaces which require coating in a line of sight with the coating source. These efforts are illustrated in copending U.S. patent application Ser. No. 08/813,384, filed on Mar. 6, 1997, to Steven M. Burns et al., entitled MODULAR COATING FIXTURE, and Ser. No. 08/895,980, filed on Jul. 17, 1997, to Steven M. Burns et al., entitled VARIABLE TILTING TUMBLER VACUUM COATING APPARATUS, both assigned to the assignee of the instant application.

Unfortunately, the prior art fixtures are not universal. In other words, they may not be used to coat all airfoils and vanes. Thus, there remains a need for customized coating fixtures which facilitate the fabrication of substantially uniform coatings along the surfaces of workpieces and which are economically viable.

The coating fixture of the present invention meets the foregoing requirements and needs.

SUMMARY OF THE INVENTION

It is an object of the present invention to provide a rotisserie type fixture for use in the coating of a wide variety of workpieces.

It is a further object of the present invention to provide a coating fixture as above which allows simultaneous coating of a plurality of workpieces.

It is yet another object of the present invention to provide a coating fixture as above which is relatively inexpensive to fabricate and modular in nature.

It is still a further object of the present invention to provide a coating fixture as above which promotes the production of high quality and evenly distributed coatings.

The foregoing objects are attained by the coating fixture of the present invention.

In accordance with the present invention, the coating fixture comprises a support structure and means attached to the support structure for allowing it to be rotated about a first axis. The fixture further comprises cassette means within the support structure for holding one or more workpieces to be coated. The cassette means are joined to the support structure by spindles which allow the cassette means to rotate about a second axis substantially parallel to the first axis and thereby allow each workpiece being coated to rotate about its longitudinal axis. The cassette means support each workpiece so that surfaces of the airfoil to be coated are maintained substantially parallel to the coating source.

In a preferred embodiment of the present invention, there are two cassette means supported in the fixture with each cassette means in turn supporting two workpieces to be coated. The cassette means has a first means for supporting the root end of each workpiece positioned therein and a second means for supporting the tip end of each workpiece positioned therein.

Other details of the coating fixture of the present invention, as well as other objects and advantages attendant thereto, are set forth in the following detailed description and the accompanying drawings wherein like reference numerals depict like elements.

DETAILED DESCRIPTION OF THE PREFERRED EMBODIMENT(S)

Figure 1:
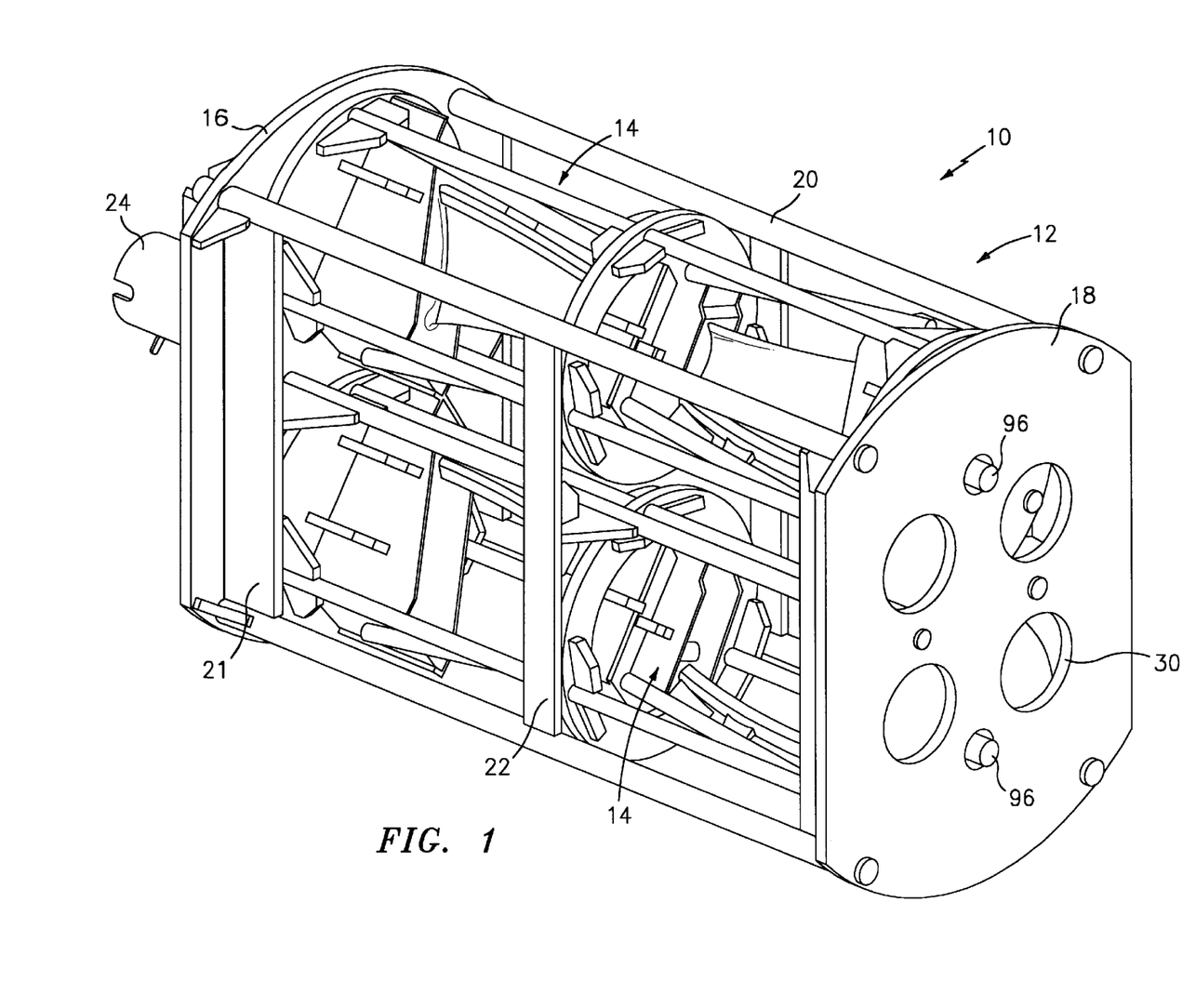
FIG. 1 is a perspective view of a coating fixture in accordance with the present invention.
Figure 2:
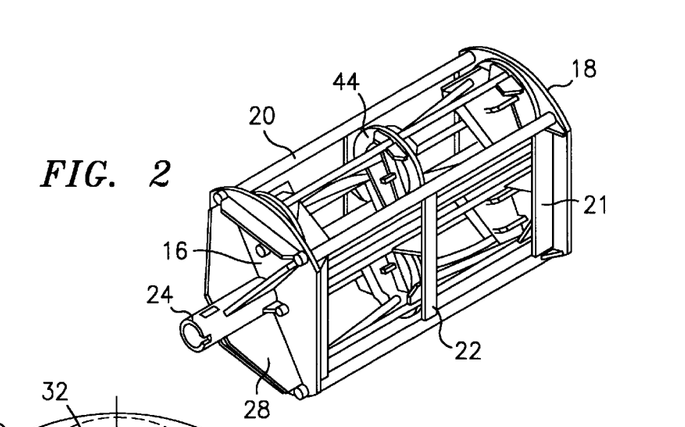
FIG. 2 is another perspective view of the coating fixture of FIG. 1.
Figure 3:
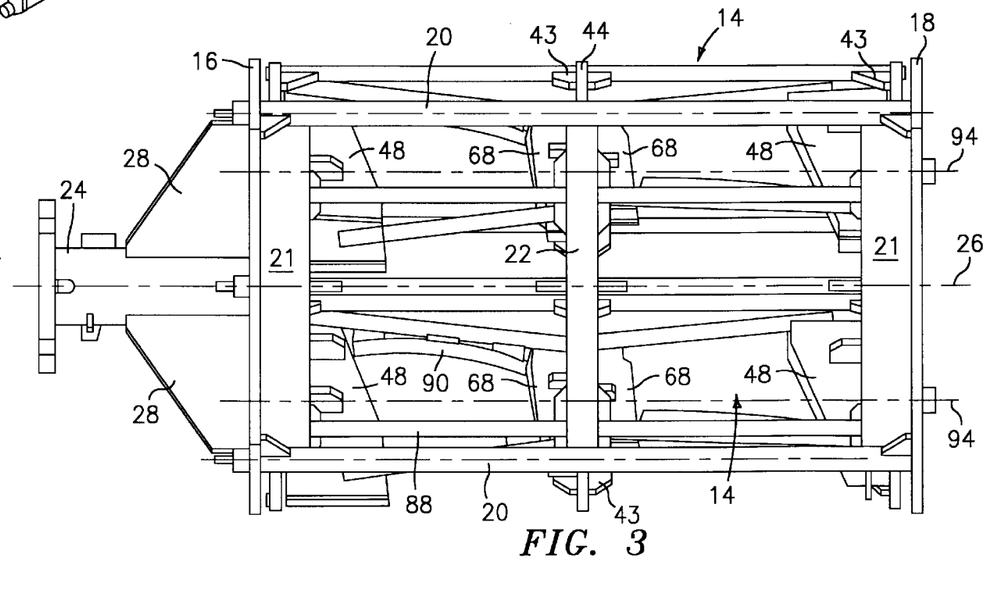
FIG. 3 is a side view of the coating fixture of FIG. 1.

Referring now to the drawings, FIGS. 1–3 show the coating fixture 10 of the present invention. The coating fixture 10 has two main components—a support structure 12 and cassettes 14 mounted within the support structure 12 for supporting the workpieces 15 to be coated for rotation about their longitudinal axes. In operation, the workpieces 15, such as airfoils and vanes, to be coated are positioned entirely within the spaced defined by the cassettes 14.

The support structure 12 is formed by two spaced apart end plates 16 and 18. The end plates 16 and 18 are joined together by a plurality of rod-shaped structural members 20 and side pieces 21. While the rod-shaped structural members and the side pieces 21 may be joined to the end plates 16 and 18 in any desired manner, it is preferred that they be welded to respective ones of said end plates. If desired, the side pieces 21 may be integrally formed with the end plates 16 and 18. The support structure 12 further includes two centrally positioned, strap like members 22 affixed to the rod-shaped structural members 20 along two sides of the support structure. The strap like members 22 are preferably welded at their ends to two of the members 20 so as to provide integrity and rigidity to the support structure 12.

As best shown in FIG. 3, a stub shaft 24 is welded to the end plate 16. The stub shaft 24 is aligned with the central axis 26 of the fixture 10 and is used to connect the fixture 10 to a drive system 27 for causing the fixture 10 to rotate about the central axis 26. The stub shaft 24 may be joined to the drive system in any desired manner known in the art. For example, the stub shaft 24 could be joined to the drive system by the connector system shown in allowed U.S. patent application Ser. No. 08/782,398, entitled MODULAR COATING FIXTURE, to Menchetti et al., which is hereby incorporated by reference herein. In order to provide structural integrity to the stub shaft, a plurality of plates 28 are spaced about the periphery of the stub shaft 24 and welded to both the stub shaft 24 arid the end plate 16.

Figure 4:
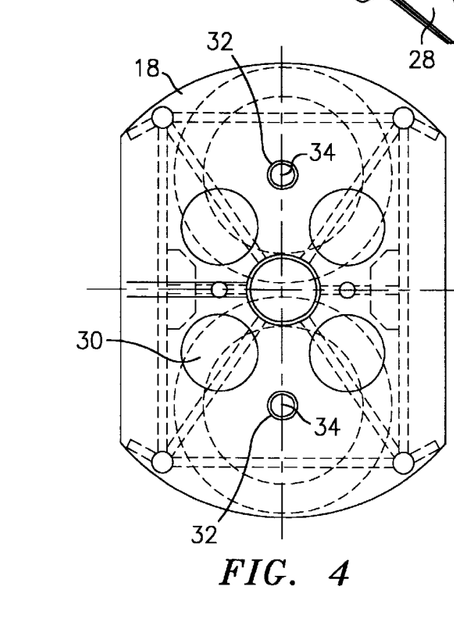
FIG. 4 is an end view of the coating fixture of FIG. 1.

Referring now to FIG. 4, each of the end plates 16 and 18 has a plurality of holes 30 to reduce the weight of the fixture 10. Further, each of the end plates 16 and 18 has two bushings 32 mounted therein, whose function will be described hereinafter. As can be seen from FIG. 4, the bushings 32 have bores 34 which are aligned with the central axis 26.

The various components of the support structure 12 may be formed from any suitable material known in the art. For example, all the components of the support structure, as well as all the components of the cassettes, may be formed from a metallic material such as HASTALLOY-X.

Figure 5A:
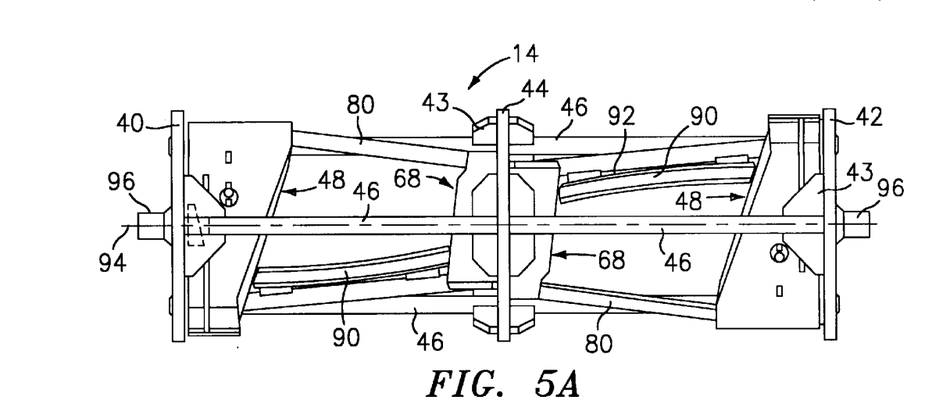
FIG. 5A is a side view of one of the cassettes used in the coating fixture of FIG. 1.
Figure 5B:
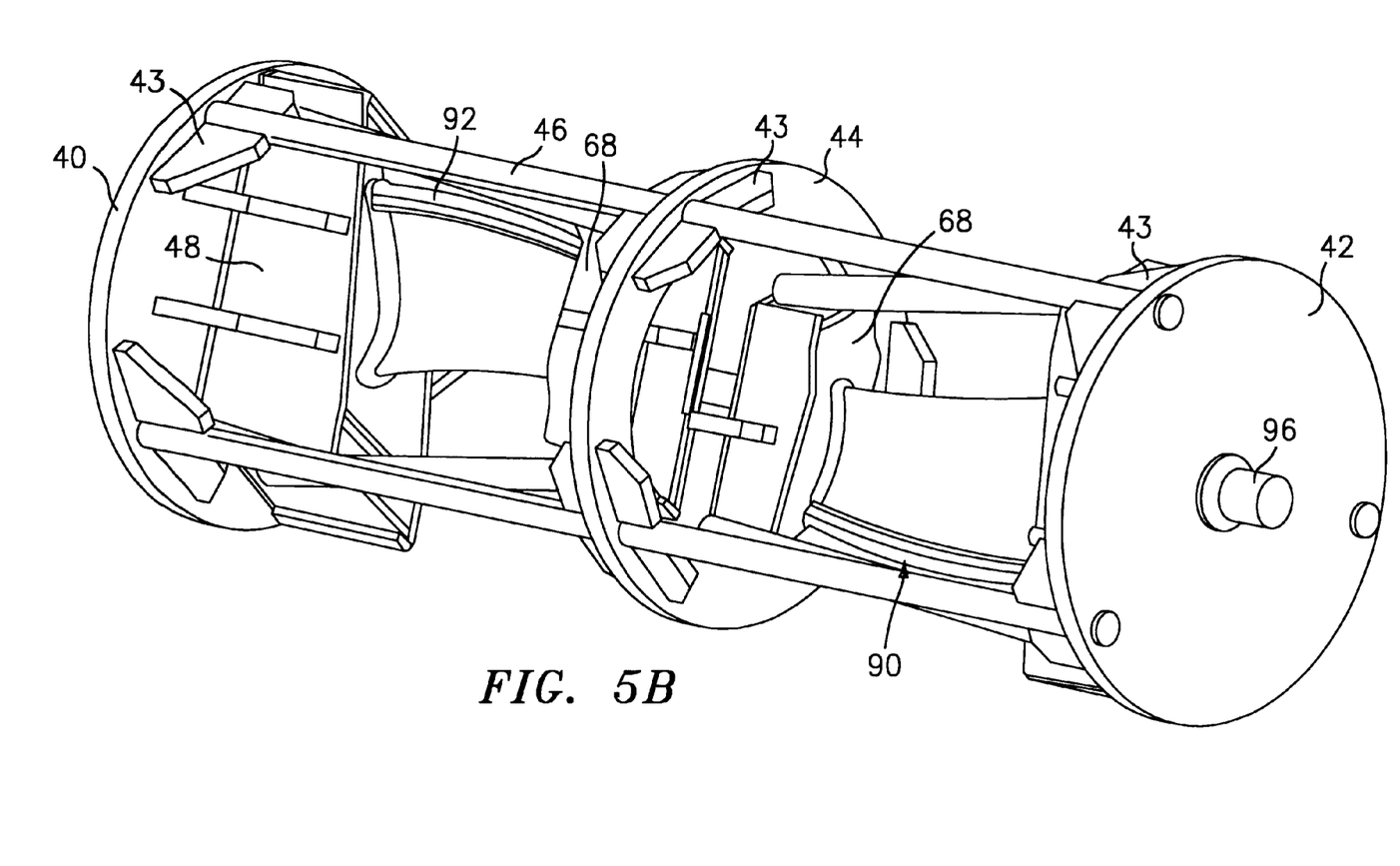
FIG. 5B is a perspective view of the cassette of FIG. 5A.

Referring now to FIGS. 5A and 5B, each cassette 14 comprises two spaced apart disc shaped end plates 40 and 42 and a central, hollow annular member 44. A plurality of rod-like members 46 are used to join the End plates 40 and 42 and the annular member 44 together to form a cage-like structure. The rod-like members 46 are preferably welded to the end plates 40 and 42 and the annular member 44. Typically, the rod-like members are spaced 120° apart about the periphery of the cassette 14. If desired, reinforcing members 43 may be provided at the intersection of the rod-like members 46 and the annular member 44 or the end plates 40 and 42 to provide the cassettes with structural integrity and rigidity. The members 43 are preferably welded to the respective rod-like and annular members arid to the end plates.

Figure 7:
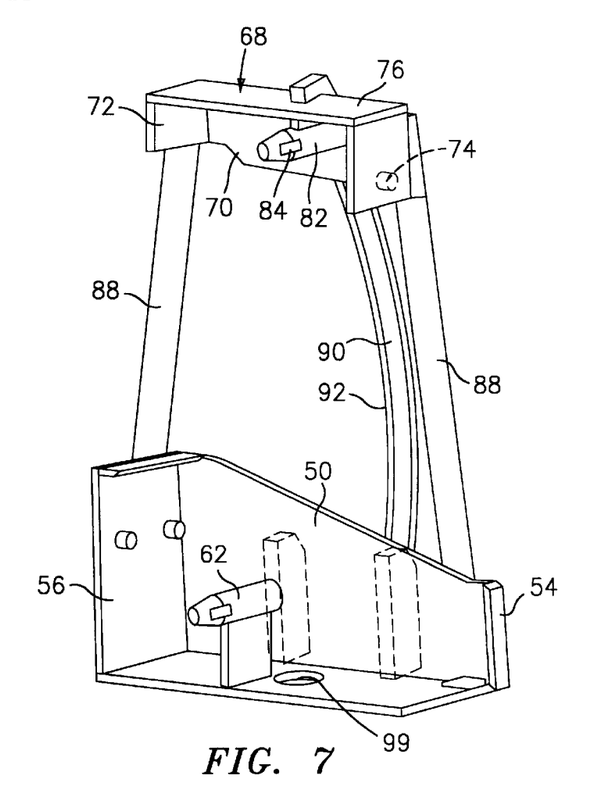
FIG. 7 is a perspective view of the receptacles for receiving the root and tip ends of the workpiece.
Figure 8:
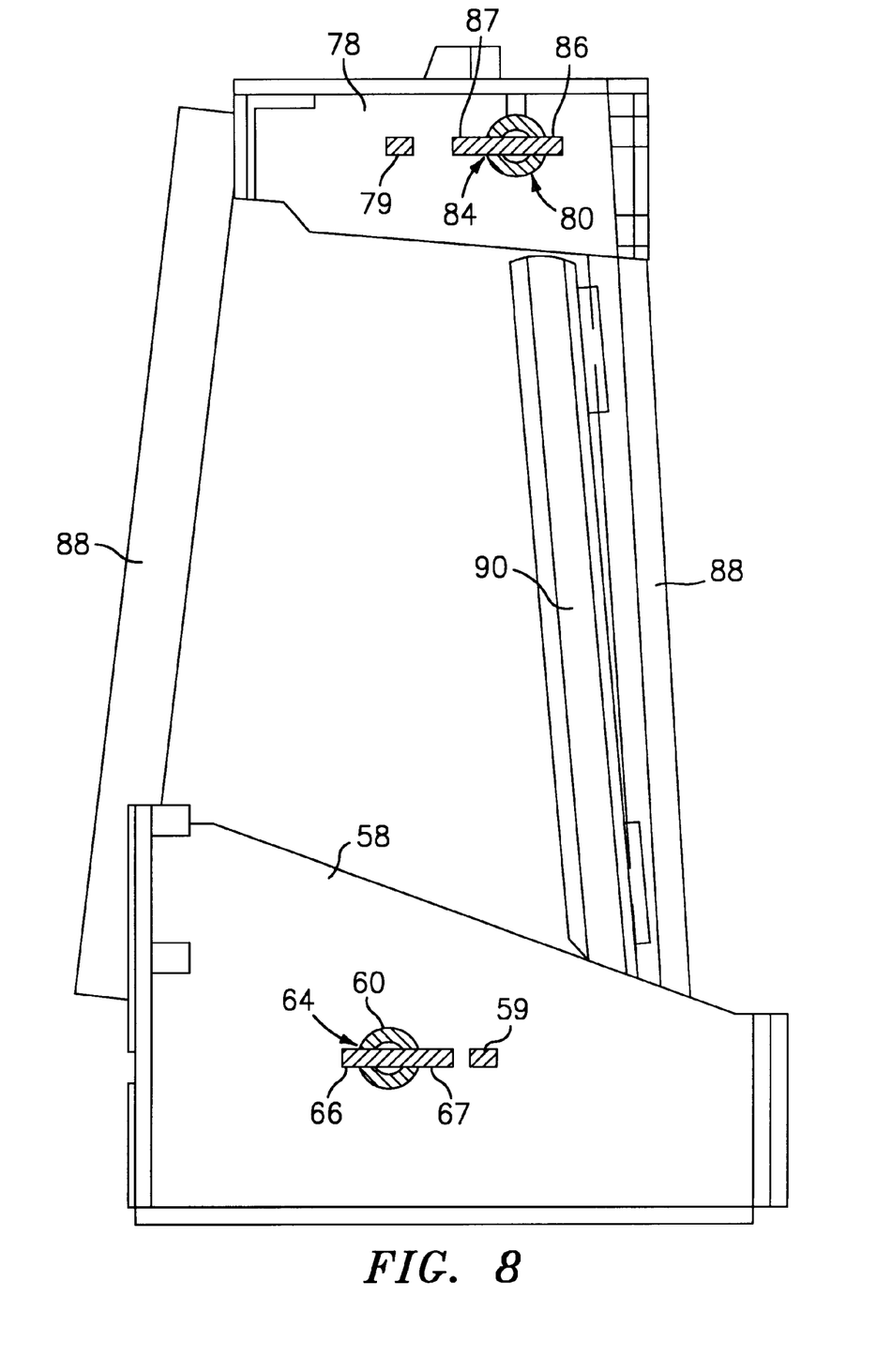
FIG. 8 is a partial sectional view of the receptacles of FIG. 7 with their covers in place.

Attached to each of the end plates 40 and 42, preferably by welding, is an open-faced receptacle 48 for receiving a first end of the workpiece 15 to be coated, typically the root end of the workpiece 1. Referring now to FIGS. 7 and 8, the receptacle 48 has a rear wall 50, two side walls 52 and 54 attached to the rear wall, and a bottom wall 56. The first end of the workpiece 15, generally the root end of the workpiece, rests in the compartment defined by the walls 50, 52, 54, and 56. The portion of the workpiece 15 to be coated projects out of the receptacle 48.

Figure 10:
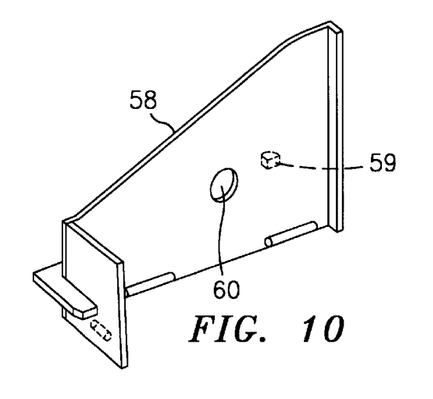
FIG. 10 is a perspective view of the cover for the receptacle housing the root end of the workpiece.

A cover 58 is provided to secure the workpiece within the receptacle 48. The cover 58, as shown in FIG. 10, has a slot 60 through which a tongue member 62 projects outwardly. The tongue member 62 is secured to one of the walls of the receptacle 48, such as bottom wall 56. The tongue member 62 has a slot 64 in it to receive a locking wedge 66. The locking wedge 66 is provided with an eyelet 67. The cover 58 also has an eyelet 59 attached to an outer surface. A wire (not shown) is inserted through the eyelets 59 and 67 to secure the locking wedge 66 to the cover 58.

Figure 11:
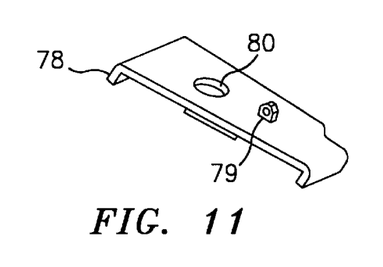
FIG. 11 is a perspective view of the cover for the receptacle housing the root end of the workpiece.

The cassette further includes a second open-faced receptacle 68 for receiving a second end, typically the tip end, of the workpiece 15 being coated. The receptacle 68 is constructed in a manner similar to the way in which the receptacle 48 is constructed. There is a rear wall 70, two side walls 72 and 74, and a top wall 76 defining a space into which the second end of the workpiece 15 is placed. A cover 78, shown in FIG. 11, is provided to secure the second end of the workpiece in place. As before, the cover 78 has a slot 80 for receiving a tongue-like member 82 attached to one of the walls of the receptacle 68, preferably the top wall 76. The tongue-like member 82 has a slot 84 for receiving a locking wedge 86 for securing the cover 78 to the receptacle 68. The cover 78 has an eyelet 79 on its outer surface. Similarly, the locking wedge 86 has an eyelet 87. A wire (not shown) may be passed through the eyelets 79 and 87 to secure the locking wedge 86 to the cover 78.

The receptacle 68 is attached to the receptacle 48 by a plurality of members 88 and 90 so as to be free-floating. The members 88 and 90 are preferably welded at their ends to various walls of the receptacles 48 and 68. The member 90 is preferably curved so as to conform to the shape of an edge of the workpiece, typically the trailing edge. The member 90 has a masking device 92 welded to it, or incorporated therein, to prevent a particular portion of the workpiece, such as a trailing edge having a plurality of openings therein, from being coated.

Figure 6:
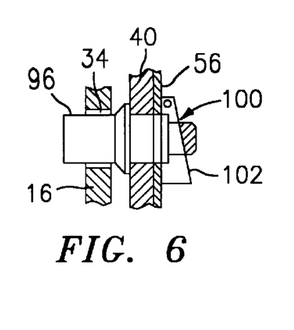
FIG. 6 is an enlarged section view of a portion of the cassette of FIG. 5.

The cassettes 14, in operation, are intended to rotate about a second axis 94 which is parallel to the axis 26. To this end, two spindles 96 are used to mount each cassette means 14 in the support structure 12. Referring now to FIG. 6, the spindles 96 each pass through the bore 34 in a respective one of the bushings 32, through an opening 98 in one of the end plates 40 and 42, and into the bottom of the receptacle 48 via an opening 99 in the bottom wall 56. The portion of the spindle 96 within the receptacle 48 has a slot 100 for receiving a locking wedge 102 which secures the spindle 96 against the bottom wall 56 of the receptacle 48.

In the event it becomes necessary to remove one of the cassettes 14 from the support structure 12, one need only remove the locking wedges 102, withdraw the spindle through the opening 99 in the bottom wall 56 and the openings 98 in the end plates 40 and 42 and lift the cassette 14 between two of the rod-shaped structural members 20 not connected together by one of the strap-like members 22. As shown best in FIG. 4, the upper and lower pairs of the structural members 20 are separated by a distance sufficient to allow the cassettes 14 to be lifted out of and removed from the support structure.

In operation, four workpieces 15 are loaded into the cassettes 14, two workpieces 15 to each cassette. The workpieces 15 are each loaded by inserting them through the space between members 88 and 90 and placing a first end of the workpiece 15 in a respective one of the receptacles 48 and a second end of the workpiece 15 in a respective one of the receptacles 68. The covers 58 and 78 are then placed over the receptacles 48 and 68 and locked in position. The fixture 10 is then mounted to the drive system 27 of a coater using the stub shaft 24 and the connection arrangement (not shown).

Figure 9:
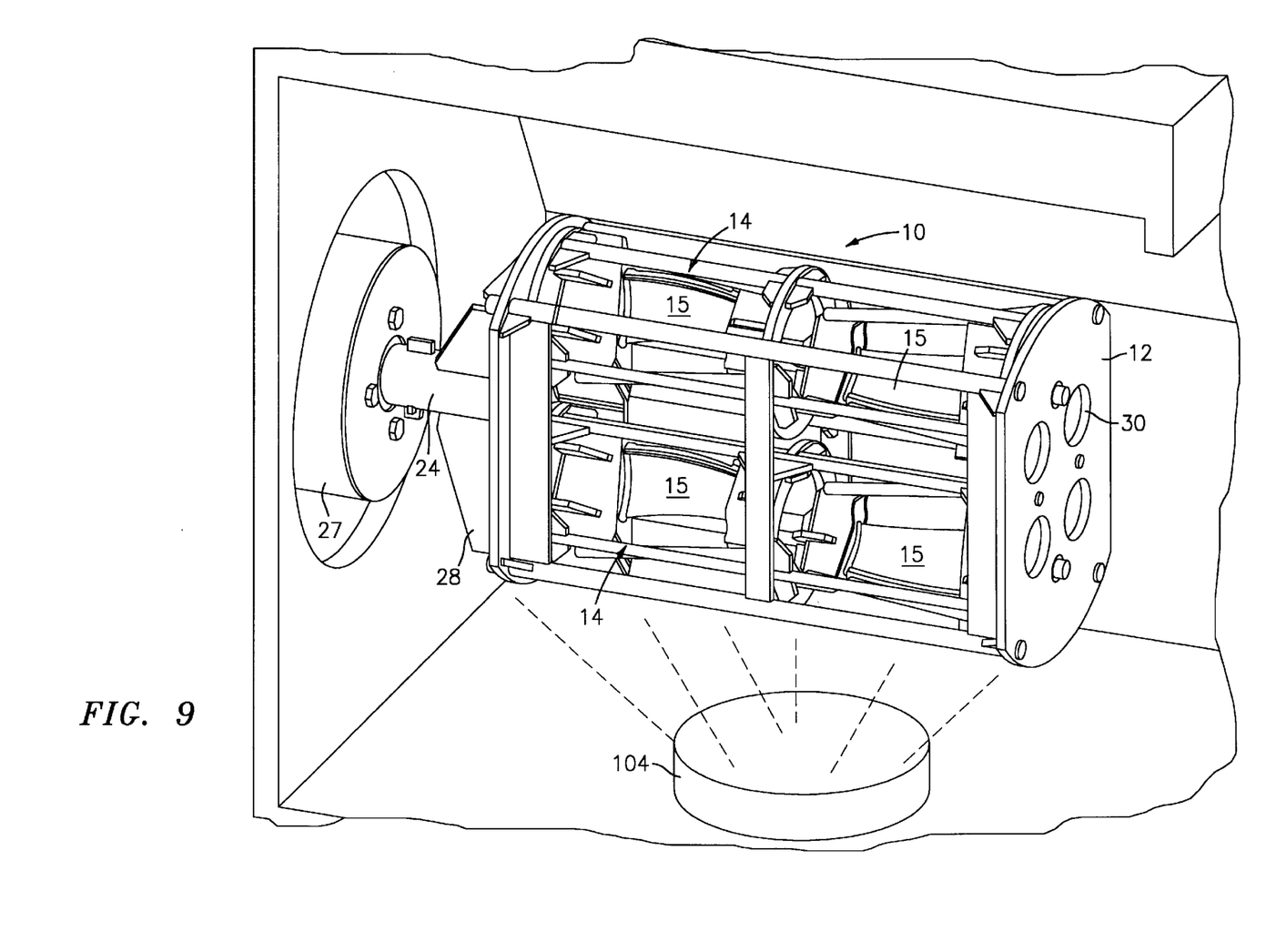
FIG. 9 is a side view of the coating fixture of the present invention holding workpieces to be coated over a source of coating material.

During coating, as shown in FIG. 9, the fixture 10 is suspended above and in close proximity to a source 104 of coating material. The fixture 10 is rotated about the central axis 26 by the coater drive system. While the fixture 10 is being rotated, each cassette 14 is free to rotate about the axis 94 defined by its spindles 96. This in turn causes the workpieces 15 being coated to rotate about their longitudinal axes. Rotation of the fixture 10 and the cassettes 14 continues until a desired coating has been formed on those surfaces of the workpiece 15 in a line of sight with the source 104.

The fixture of the present invention is a relatively inexpensive, modular, self manipulating coating apparatus that is capable of applying a relatively even distributed coating over a significantly sized, multitude of dual shrouded complex geometry airfoil surfaces, i.e. vanes. It has been found that the fixture 10 of the present invention has particular utility in the coating of turbine engine dual shrouded airfoils. One of the advantages to the fixture of the present invention is that it allows the surfaces of the workpiece being coated to remain relatively parallel to the source of the coating material. Yet another advantage is that the workpiece being coated is protected during the coating operation since it is maintained within the space defined by the cassettes and the support structure.

It is apparent that there has been provided in accordance with the foregoing description a modular rotisserie EB-PVD coating fixture which fully satisfies the means, objects and advantages set forth hereinbefore. While the present invention has been described in connection with specific embodiments thereof, it will be apparent to those skilled in the art that there are many alternatives, modifications and variations thereof. It is intended to embrace such alternatives, modifications and variations as may fall within the broad scope of the appended claims.

What is claimed is:

1. A fixture for use in a coating operation which comprises:

a support structure;

means attached to said support structure for allowing said support structure to be rotated about a first axis;

cassette means within said support structure for holding a workpiece to which a coating is to be applied;

said cassette means surrounding said workpiece from a root end of said workpiece to a tip end of said workpiece; and said cassette means being joined to said support structure so as to allow said cassette means to rotate about a second axis substantially parallel to said first axis.

2. The fixture of claim 1, wherein said support structure comprises two spaced apart end plates joined together by at least one structural member and wherein said means for allowing said support structure to be rotated about said first axis is joined to one of said end plates.

3. The fixture of claim 2 wherein said end plates are joined together by a plurality of structural members which form a cage-like structure for said cassette means.

4. The fixture of claim 2 wherein each said end plate has a plurality of holes for reducing the weight of the fixture.

5. The fixture of claim 1, wherein said means for joining said cassette means to said support structure comprises spindle means adjacent each end of said cassette means, said spindle means defining said second axis.

6. The fixture of claim 5 further comprising said support structure having two spaced apart end plates, each said end plate having at least one bushing for receiving said spindle means.

7. The fixture of claim 5 wherein said cassette means includes first means for holding a first end of said workpiece and second means for holding a second end of said workpiece.

8. The fixture of claim 7 wherein each said first means has an opening in a wall for receiving an end of said spindle means and further comprising means for securing said spindle means to said first means.

9. The fixture of claim 7 wherein said first and second means are joined together by a plurality of rod-like members.

10. The fixture of claim 9 further comprising means for masking a portion of said workpiece attached to one of said rod-like members.

11. The fixture of claim 5 wherein each of said first and second means comprises an open-faced receptacle for receiving a respective end of said workpiece and a cover for closing said open-faced receptacle after said workpiece end has been placed therein.

12. The fixture of claim 11, wherein each of said first and second means includes means for locking said cover to said open-faced receptacle.

13. The fixture of claim 1 wherein said cassette means comprises at least two cassettes for holding a plurality of workpieces.

14. The fixture of claim 13 further comprising:

said support structure having two spaced apart end plates and a plurality of structural members forming a cage-like structure; and said cassettes being positioned within said cage-like structure.

15. The fixture of claim 14 wherein each said cassette comprises two spaced apart end plates joined together by a plurality of rod-like members and said joining means comprising two spindles, each said spindle passing through a bore in one of said support structure end plates and through an opening in one of said cassette end plates, and said spindles defining said second axis.

16. The fixture of claim 14 wherein each cassette end plate has a first means for receiving a first end of said workpiece attached to it and wherein said cassette means further comprises second means for receiving a second end of said workpiece, said second means being spaced from and attached to said first means.

17. The fixture of claim 16 wherein said first means and second means support each support a workpiece so as to allow said workpiece to rotate about its longitudinal axis while being maintained substantially parallel to a source of coating material.

18. The fixture of claim 1 wherein said cassette means is removably attached to said support structure.

19. A method for simultaneously coating a plurality of workpieces comprising the steps of:

provinding a fixture having at least one cassettes for holding a plurality of workpieces;

positioning said workpieces within said at least one cassette so that said workpieces are aligned in an axial direction;

attaching said fixture to a coater drive system;

positioning said fixture over a source of coating material;

rotating each of said workpieces about its longitudinal axis by operating said drive system to cause said fixture to rotate about a first axis, and said at least one cassette to rotate about a second axis substantially parallel to said first axis.

20. The method of claim 19 wherein:

said providing step comprises providing a fixture having a plurality of cassettes for holding a plurality of workpieces; and said rotating step comprises causing a first one of said cassettes to rotate about said second axis and a second one of said cassettes to rotate about a third axis substantially parallel to said first axis and said second axis.

* * * * *